United States Patent [19]
Zook

[11] Patent Number: 6,047,395
[45] Date of Patent: Apr. 4, 2000

[54] ERROR CORRECTION PROCESSOR FOR CORRECTING A MULTI-DIMENSIONAL CODE BY GENERATING AN ERASURE POLYNOMIAL OVER ONE DIMENSION FOR CORRECTING MULTIPLE CODEWORDS IN ANOTHER DIMENSION

[75] Inventor: Christopher P. Zook, Longmont, Colo.

[73] Assignee: Cirrus Logic, Inc., Fremont, Calif.

[21] Appl. No.: 09/016,563

[22] Filed: Jan. 30, 1998

[51] Int. Cl.[7] .................................................. H03M 13/00
[52] U.S. Cl. .......................... 714/756; 714/755; 714/785
[58] Field of Search ................................... 714/769, 765, 714/752, 756, 781, 793, 767, 755, 785

[56] References Cited

U.S. PATENT DOCUMENTS

| | | | |
|---|---|---|---|
| 4,845,714 | 7/1989 | Zook | 714/755 |
| 5,297,153 | 3/1994 | Baggen et al. | 714/782 |
| 5,373,513 | 12/1994 | Howe et al. | 714/772 |
| 5,408,477 | 4/1995 | Okada et al. | 714/755 |
| 5,412,667 | 5/1995 | Havemose | 714/756 |
| 5,414,719 | 5/1995 | Iwaki et al. | 714/785 |
| 5,446,743 | 8/1995 | Zook | 714/784 |
| 5,467,297 | 11/1995 | Zook | 708/492 |
| 5,517,509 | 5/1996 | Yoneda | 714/785 |
| 5,563,897 | 10/1996 | Pyndiah et al. | 714/755 |
| 5,600,662 | 2/1997 | Zook | 714/769 |
| 5,602,857 | 2/1997 | Zook et al. | 714/769 |
| 5,629,949 | 5/1997 | Zook | 714/769 |
| 5,844,920 | 12/1998 | Zook et al. | 714/769 |
| 5,878,058 | 3/1999 | Im | 714/784 |
| 5,974,580 | 10/1999 | Zook et al. | 714/755 |

OTHER PUBLICATIONS

Fast Erasure–And–Error Decoding of Algebraic Geometry Codes up to the Feng–Rao Bound (Sakata, et al., IEEE), Jul. 1998.

An On–The–Fly Decoding Technique For Reed–Solomon Codes {Yuan Xing Lee, et al., IEEE), Sep. 1996.

Closed Solution Of Brelekamp's Algorithm For Fast Decoding Of BCH Codes (Clifford Kraft, IEEE), Dec. 1991.

New Decoder For Double–Error–Correcting Binary BCH Codes (E.–H Lu, et al., IEE), Jun. 1996.

*Primary Examiner*—Albert De Cady
*Assistant Examiner*—Guy Lamarre
*Attorney, Agent, or Firm*—Howard H. Sheerin; Dan Shifrin

[57] ABSTRACT

An error correction processor is disclosed for correcting errors in binary data read from a disk storage medium, wherein the binary data comprises a first and second set of intersecting ECC codewords of a multi-dimensional codeword. The error correction processor comprises a data buffer for storing the ECC codewords read from the disk storage medium; a syndrome generator for generating ECC syndromes in response to a codeword in the second set; an error-locator polynomial generator for generating an error locator polynomial $\sigma(x)$ in response to the ECC syndromes; a selector for selecting between the error-locator polynomial $\sigma(x)$ and an erasure polynomial $\sigma(x)_{EP}$, wherein:

(i) the erasure polynomial $\sigma(x)_{EP}$ is generated while processing the first set codewords; and (ii) the erasure polynomial $\sigma(x)_{EP}$ is used to correct at least two codewords in the second set; and an error corrector for generating correction values in response to either the error-locator polynomial $\sigma(x)$ or the erasure polynomial $\sigma(x)_{EP}$ output by the selector, the correction values for correcting errors in the codeword in the second set.

27 Claims, 8 Drawing Sheets

ERROR CORRECTION PROCESSOR FOR CORRECTING A MULTI-DIMENSIONAL CODE BY GENERATING AN ERASURE POLYNOMIAL OVER ONE DIMENSION FOR CORRECTING MULTIPLE CODEWORDS IN ANOTHER DIMENSION

CROSS REFERENCE TO RELATED APPLICATIONS AND PATENTS

This application is related to U.S. Pat. No. 5,446,743 entitled "COEFFICIENT UPDATING METHOD AND APPARATUS FOR REED-SOLOMON DECODER," and U.S. Pat. No. 5,467,297 entitled "FINITE FIELD INVERSION," which are incorporated herein by reference.

FIELD OF INVENTION

The present invention relates to error correcting systems for computer storage devices, particularly to an efficient method and apparatus for correcting a multi-dimensional code, such as a product code, by generating an erasure polynomial over one dimension for use in correcting codewords in another dimension.

BACKGROUND OF THE INVENTION

In computer storage devices (such as magnetic and optical disk drives) the bandwidth of the recording channel is limited, as well is the signal power. To achieve performance gains, various coding techniques are employed to increase the effective signal-to-noise ratio (SNR) by increasing the system's immunity to noise. This allows an increase in storage capacity by increasing the recording density while maintaining an arbitrarily low bit error rate.

In error correction coding (ECC), the binary data to be recorded are processed mathematically to generate redundancy symbols that are appended to the data to form codewords which are written to the disk storage medium. Upon readback, the recorded codewords are estimated (detected) from the read signal, and the redundancy symbols are used to decode the estimated codewords back into the originally recorded user data. The redundancy symbols provide, in effect, a buffer which shields the codeword from noise as it passes through the recording channel. When enough noise "penetrates" this buffer, it mutates a written codeword into a different received codeword, thereby resulting in an error when decoded into the user data.

The more redundancy symbols employed in an error correction code, the larger the buffer around the codeword and the more noise that can be tolerated before a decoding error occurs. However, there is an upper bound on the performance of any given recording channel known as the "channel capacity" which refers to the maximum user data transmission rate (or recording density) achievable for a given channel while maintaining an arbitrarily low bit error rate. Ultimately, the channel capacity is a function of the channel bandwidth and the signal to noise ratio (SNR). As mentioned above, error correction codes are a means for improving performance by increasing the effective SNR.

There are many approaches to encoding/decoding the user data in order to maximize the reliability and efficiency of a recording channel; ultimately, the goal is to design a system that approaches the channel capacity while minimizing the implementation complexity and cost. Block error correcting codes are commonly employed in disk storage systems, particularly the Reed-Solomon block code due to its excellent error correction properties and low implementation cost and complexity.

Block codes encode a k-symbol input block of the source data stream into an n-symbol output block or codeword where n-k is the number of redundancy symbols and k/n is referred to as the code rate. The codewords are then transmitted through (stored to) the communication medium and decoded by the receiver. The encoding process performs a mathematical operation over the input block such that the output codewords are different from one another by a parameter referred to as the minimum distance of the code $d_{min}$. The minimum distance $d_{min}$ between codewords determines the amount of noise that the system can tolerate before a received codeword is decoded erroneously.

With Reed-Solomon codes, the data stream is processed as a sequence of symbols, where the symbols are typically selected from a finite field $GF(2^w)$. The parameter w denotes the number of binary data bits per symbol. Each symbol of the k-symbol input block represents the coefficients of a data polynomial $D(x)$. The redundancy symbols (which are also represented as a polynomial $W(x)$) are then computed as the modulo division of the input data polynomial $D(x)$ divided by a generator polynomial $G(x)$:

$$W(x) = (x^m \cdot D(x)) \text{ MOD } G(x)$$

where m is the degree of the generator polynomial which equals the number of redundancy symbols. The redundancy polynomial $W(x)$ is then added to the data polynomial $D(x)$ to generate a codeword polynomial $C(x)$:

$$C(x) = (x^m \cdot D(x)) + W(x).$$

Those skilled in the art understand that the encoder circuitry for performing the above operations can be implemented with minimum cost using a linear feedback shift register (LFSR).

After encoding, the codeword $C(x)$ is transmitted through the noisy communication channel, wherein the received codeword $C'(x)$ equals the transmitted codeword $C(x)$ plus an error polynomial $E(x)$. The received codeword $C'(x)$ is corrected according to the following steps: (1) compute error syndromes $S_i$; (2) compute the coefficients of an error locator polynomial using the error syndromes $S_i$; (3) compute the roots of the error locator polynomial, the logs of the roots are the error locations $\ell$; and (4) compute the error values using the error syndromes $S_i$ and the roots of the error locator polynomial.

The error syndromes $S_i$ are computed as the modulo division of the received codeword polynomial $C'(x)$ divided by the factors of the generator polynomial $G(x)$:

$$S_i = C'(x) \text{ MOD } (x + \alpha^i)$$

when $$G(x) = \prod_{i=0}^{m-1} (x + \alpha^i)$$

where $\alpha$ is a primitive element of the finite field $GF(2^w)$. Techniques for performing the other steps of the decoding process, computing the error locator polynomial, computing the roots of the error locator polynomial, and computing the error values, are well known by those skilled in the art. See, for example, the above referenced U.S. Pat. No. 5,446,743 entitled "COEFFICIENT UPDATING METHOD AND APPARATUS FOR REED-SOLOMON DECODER."

The use of erasure pointers is a well known technique for increasing the power of an error correction code. An erasure pointer is an address pointing to a symbol location of a codeword where an error is likely to have occurred. For example, an erasure pointer may be generated by detecting timing phase errors or marginal amplitude in the read signal during read back. An address is generated to point to the codeword symbol where the timing error or amplitude attenuation was excessive. The erasure pointers are then used to augment the error correction procedure by providing information in addition to the error syndromes $S_i$. An erasure polynomial is generated using the erasure pointers, where each root of the erasure polynomial replaces a root in the error locator polynomial. If the number of erasure pointers equals the number of error syndromes, then the erasure polynomial replaces the error locator polynomial. Since the erasure pointer corresponds to the error location, only an error value need be computed for each erasure pointer, which accounts for the increase in the correction capability of the code. Without erasure pointers the code is capable of correcting only INT(m/2) codeword symbols where m is the degree of the generator polynomial (and number of error syndromes), whereas with erasure pointers the code is capable of correcting n+INT((m−n)/2) codeword symbols where n is the number of erasure pointers (in effect doubling the correction capability when the number of erasure pointers equals the number of error syndromes, i.e., when n equals m).

Another technique known in the prior art to further increase the power of an error correction code is to arrange the codewords into what is known as a multi-dimensional code, such as a two-dimensional product code. Digital Video Disk (DVD) storage systems, for example, commonly employ a two-dimensional product code shown in FIG. 2. The codewords are arranged into intersecting horizontal (row or Q) and vertical (column or P) codewords and the decoding process is carried out in iterative passes. First a pass over the horizontal codewords is performed to correct as many errors as possible; any uncorrectable horizontal codewords are left unmodified. Then a pass is made over the vertical codewords to correct as many errors as possible, where a symbol corrected in a vertical codeword also corrects the corresponding symbol for the intersecting horizontal codeword. Consequently, the horizontal codeword may be correctable during the next horizontal pass. Similarly, a symbol corrected during a horizontal pass may render a previously uncorrectable vertical codeword correctable during the next vertical pass. This iterative process continues until the entire product code is corrected, or deemed uncorrectable.

An aspect of the present invention is to generate an erasure polynomial corresponding to the uncorrectable codewords in a first dimension of a multi-dimensional code, and to use the erasure polynomial in place of an error locator polynomial to correct the codewords in a second dimension. A further aspect is to generate the erasure polynomial concurrent with correcting the product code so as to avoid adding any additional latency to the correction process. Still another aspect of the present invention is to generate the erasure polynomial using efficient, cost effective circuitry.

SUMMARY OF THE INVENTION

The present invention is an error correction system for correcting a multi-dimensional code by generating an erasure polynomial for correcting codewords in a second dimension concurrent with processing the codewords in a first dimension. In an example embodiment, the multi-dimensional code is a two-dimensional product code comprising intersecting horizontal (or row) and vertical (or column) codewords. During a horizontal pass over the row codewords, an erasure polynomial is generated concurrently for use in correcting the column codewords during the subsequent vertical pass. An erasure pointer is generated for each uncorrectable row codeword encountered, and a corresponding factor is added to the erasure polynomial. Because the number of uncorrectable row codewords typically encountered is small, the circuitry for generating the factors of the erasure polynomial can be implemented cost effectively using bit serial techniques without adding any significant latency to the storage system. If the number of uncorrectable row codewords encountered during a row pass is less than or equal to the number of ECC redundancy symbols in a vertical codeword, then the erasure polynomial can be used in place of the conventional error locator polynomial to correct all of the vertical codewords in the next vertical pass. This obviates the need to generate an erasure polynomial for each of the vertical codewords during the vertical pass as is typically required in the prior art. If the number of uncorrectable row codewords exceeds the number of ECC redundancy symbols in a vertical codeword, then during the vertical pass the conventional error locator polynomial is used for error correction and a similar erasure pointer polynomial is generated concurrently for correcting the row codewords during the next horizontal pass.

BRIEF DESCRIPTION OF THE DRAWINGS

The above and other aspects and advantages of the present invention will be better understood by reading the following detailed description of the invention in view of the drawings, wherein.

DETAILED DESCRIPTION OF THE PREFERRED EMBODIMENT

System Overview

Figure 1:
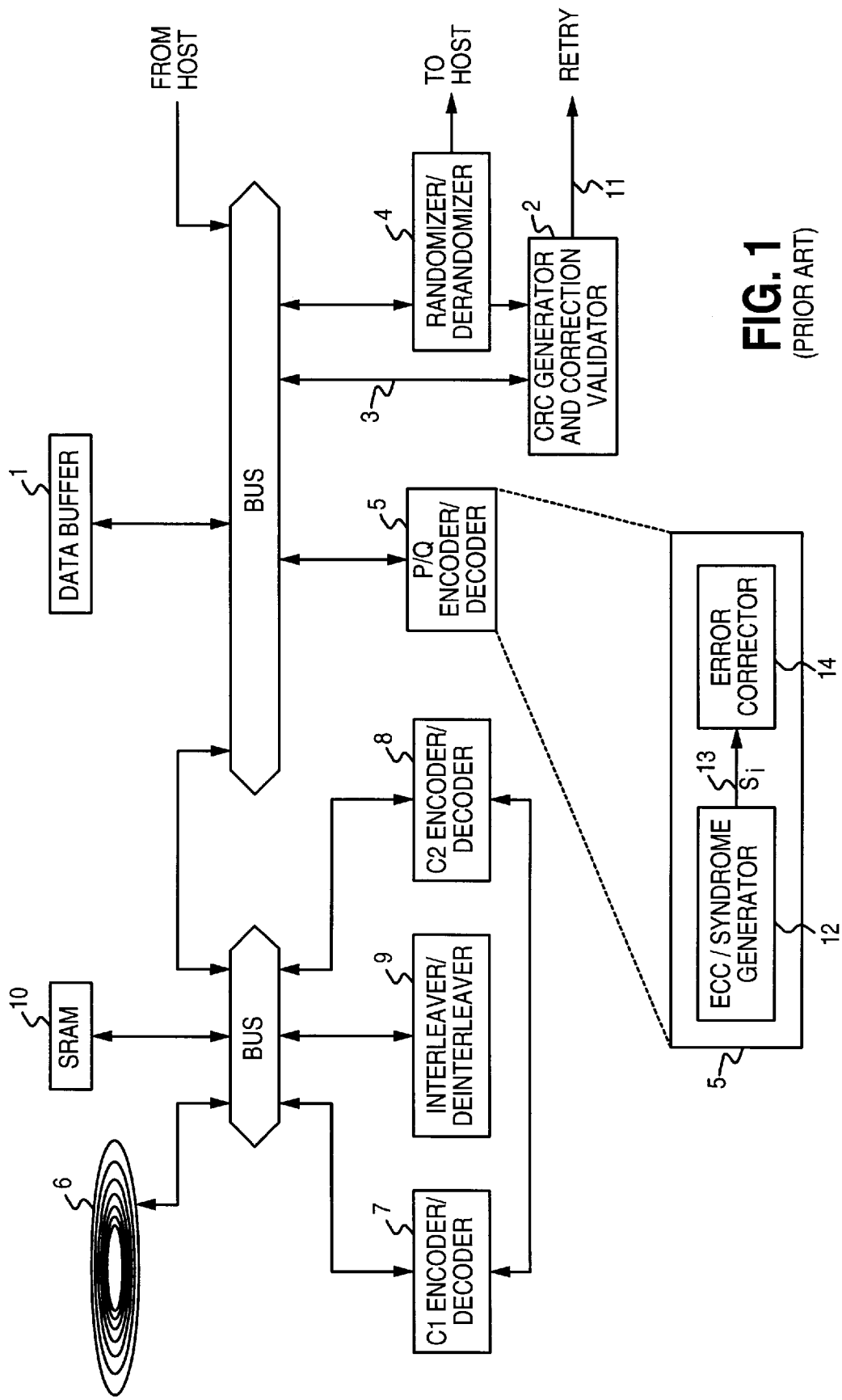
FIG. 1 is a block diagram of a prior art error correction system typically employed in a CD/DVD optical storage device.

An overview of a prior art error correction system typically found in a CD/DVD optical disk storage system is shown in FIG. 1. During a write operation (assuming the device is not read only) user data received from a host system are stored in a data buffer 1. A CRC generator-and-correction validator 2 then reads the user data from the buffer over line 3, generates CRC redundancy symbols for use in verifying the validity of any corrections made during read back, and restores the user data with appended redundancy symbols back into the data buffer 1. Thereafter the data is again read from the data buffer 1 (including the CRC redundancy), randomized by a data randomizer 4, and the randomized data restored to the data buffer 1. A P/Q encoder/decoder 5 then reads the randomized data from the data buffer 1, and an ECC/syndrome generator 12 generates the ECC redundancy symbols for the column or P and row or Q codewords to form the two-dimensional product code shown in FIG. 2. The individual P and Q codewords are restored to the data buffer 1 after appending the ECC redundancy symbols. Once the entire product code has been generated, it is read from the data buffer 1 and written to the optical storage medium 6.

If the system is configured for a compact disk (CD) data format, then additional redundancy, referred to as C1 and C2, are generated and appended to the data before writing it to the disk. Thus to facilitate the CD recording format, the error correction system comprises a C1 encoder/decoder 7, a C2 encoder/decoder 8, and an interleaver/deinterleaver 9 for implementing the well known Cross Interleave Reed-Solomon Code (CIRC). Typically a static RAM (SRAM) 10 is employed to implement the CIRC coding process; SRAM is much faster than dynamic RAM (DRAM), the latter being used to implement the data buffer 1.

During a read operation, the process is run in reverse. If configured for CD format, then the C1 and C2 decoders make preliminary corrections to the randomized data as it is read from the optical disk 6 and stored in the data buffer 1. Once a complete product code is available in the data buffer 1, the P/Q decoder 5 begins the iterative passes over the P and Q codewords to make further corrections. The ECC/syndrome generator 12 generates ECC syndromes $S_i$ transmitted over line 13 to an error corrector 14. The error corrector 14 uses the ECC syndromes $S_i$ to correct errors in the individual codewords as described above. If at the end of a P or Q pass all of the ECC error syndromes are zero, indicating that the product code is error free (unless miscorrected), then the randomized data is read from the data buffer 1 and derandomized by derandomizer 4. As the data is derandomized, it is processed by the CRC generator-and-correction validator 2 to generate the CRC syndrome. If the CRC syndrome is zero, indicating that the corrections to the P and Q codewords are valid and complete, then the data is again read from the data buffer 1, derandomized, and the derandomized data transferred to the host system. If the CRC syndrome is non-zero, indicating that the product code has been miscorrected, then the CRC generator-and-correction validator 2 sends an error message to the host system over line 11 wherein the host system will initiate a retry operation (i.e., attempt to reread the data from the disk).

Data Format

Figure 2:
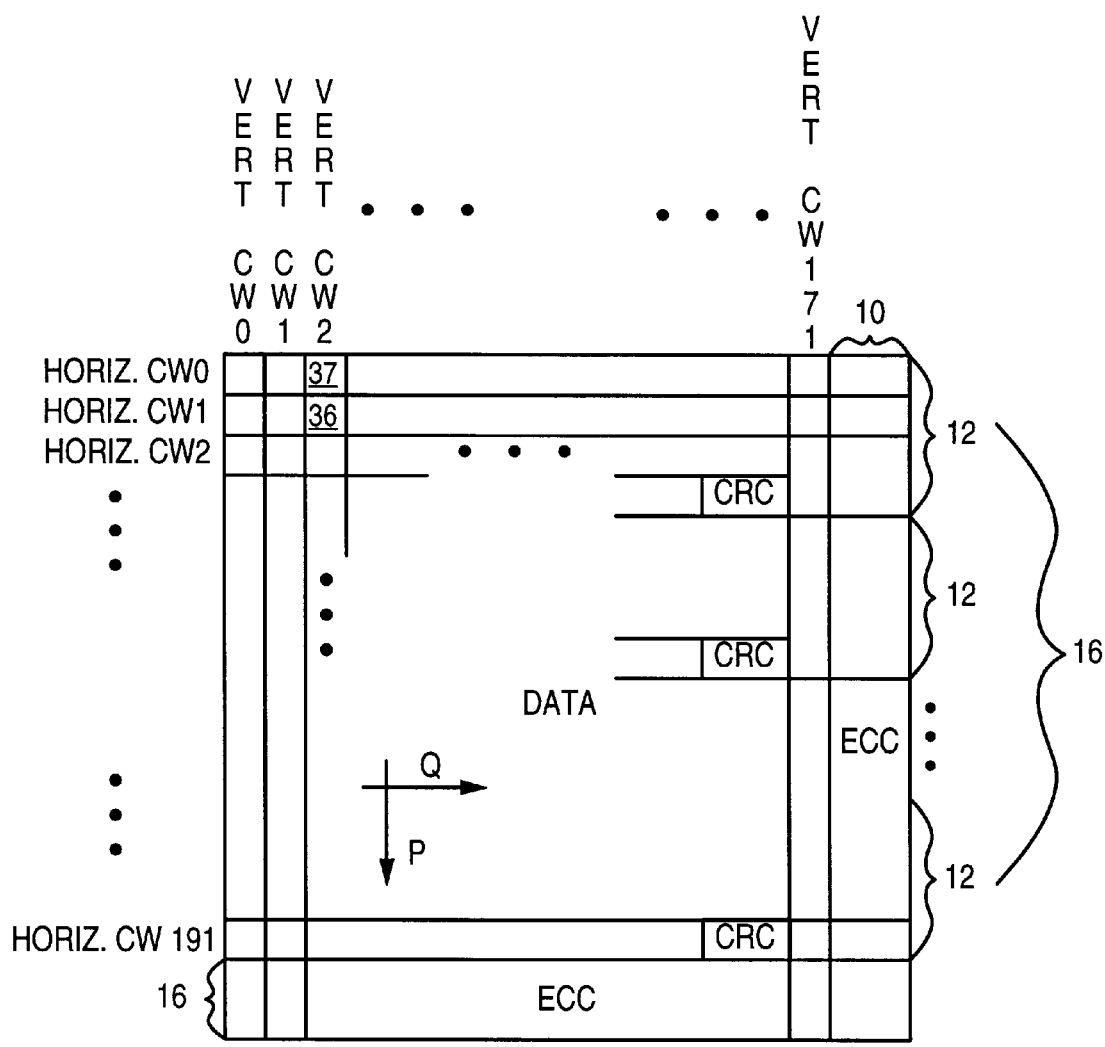
FIG. 2 shows the format of a two-dimensional product code typically employed in DVD optical storage devices comprising sixteen data sectors.

The data format of a two-dimensional product code typically employed in a DVD storage device is shown in FIG. 2. The product code comprises 16 data sectors, where each data sector comprises 12 horizontal codewords (Q codewords). Each horizontal codeword comprises 10 ECC redundancy symbols preferably generated according to a Reed-Solomon code. There are 182 vertical codewords (P codewords) each comprising 16 redundancy symbols as shown. The ECC redundancy symbols also form ECC codewords; that is, the ECC redundancy symbols are correctable in the same manner as the user data. Thus, there is a total of 182 vertical codewords including the 10 vertical ECC codewords on the right side, and 208 horizontal codewords including 16 horizontal ECC codewords on the bottom. At the end of each of the 16 data sectors are four CRC symbols for use in verifying the validity and completeness of the corrections to the codewords made using the ECC redundancy symbols.

P/Q Decoder

Figure 3:
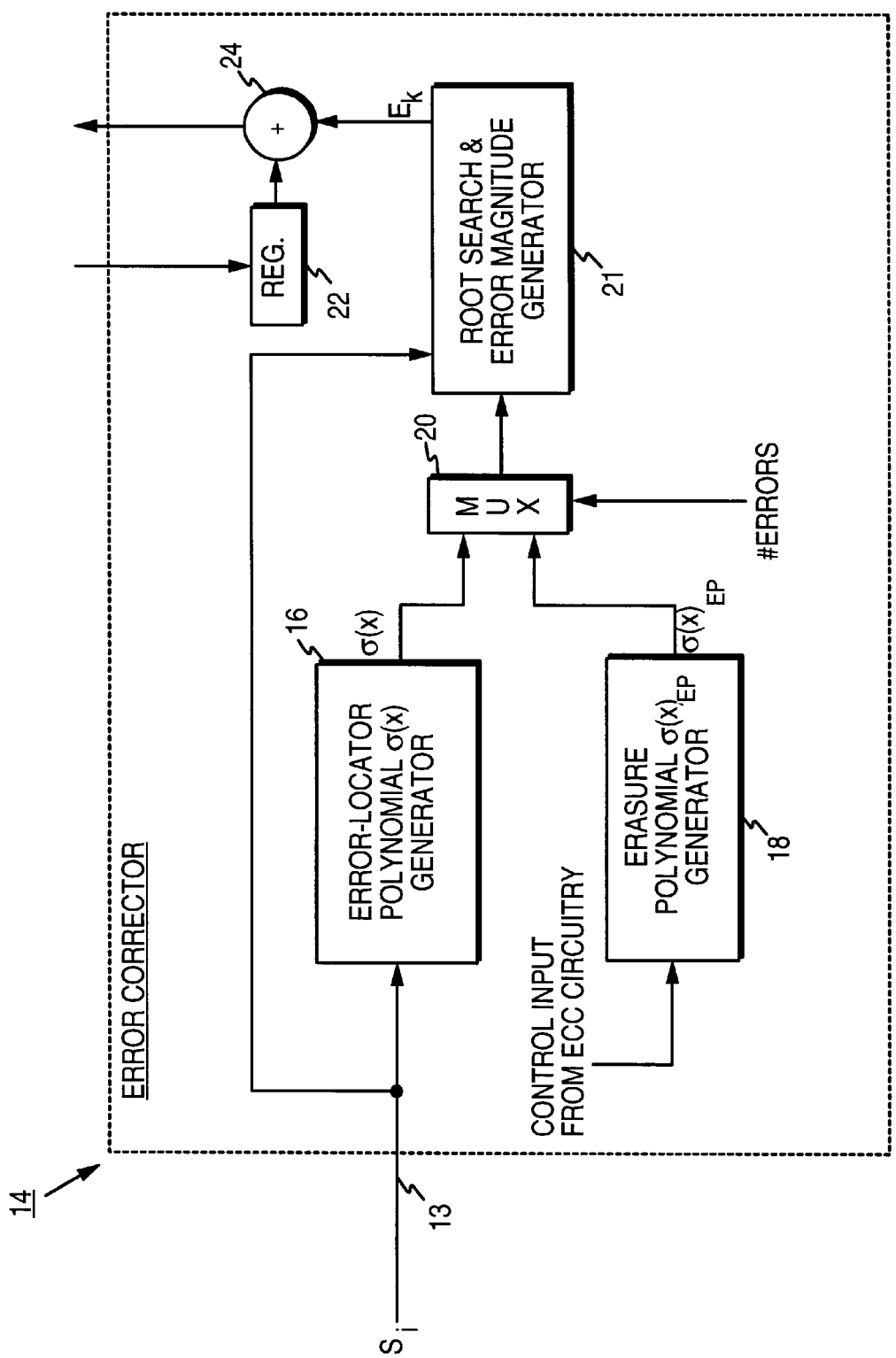
FIG. 3 is a block diagram of the error correction system of the present invention, including an erasure polynomial generator for generating an erasure polynomial corresponding to uncorrectable codewords in a first dimension, the erasure polynomial for correcting errors in codewords in a second dimension.

The present invention involves an improvement to the P/Q decoder 5 of FIG. 1, an overview of which is shown in FIG. 3. The error corrector 14 of the present invention receives error syndromes $S_i$ over line 13 that are computed for each ECC codeword (horizontal and vertical). As described above, the error syndromes $S_i$ are computed as the modulo division of the received codeword polynomial C'(x) divided by the factors of the generator polynomial G(x):

$$S_i = C'(x) \text{MOD} (x+\alpha^i)$$

when $$G(x) = \prod_{i=0}^{m-1} (x + \alpha^i)$$

where α is a primitive element of the finite field GF(2$^w$) (w denotes the number of binary data bits per codeword symbol) and m is the degree of the generator polynomial.

The error syndromes are processed by a conventional error-locator polynomial generator 16 to generate a conventional error-locator polynomial σ(x). Methods for generating the error-locator polynomial are well known in the art-any of the known methods can be used in the present invention. An example method is disclosed in the above referenced U.S. Pat. No. 5,446,743 entitled "COEFFICIENT UPDATING METHOD AND APPARATUS FOR REED-SOLOMON DECODER."

The error corrector of the present invention further employs an erasure polynomial generator 18 for generating an erasure polynomial $\sigma(x)_{EP}$. As described in greater detail below, the roots of the erasure polynomial $\sigma(x)_{EP}$ correspond to uncorrectable codewords encountered in the previous ECC pass. For example, if the P/Q decoder is processing the column codewords during a vertical pass, then the roots of the erasure polynomial $\sigma(x)_{EP}$ correspond to the uncorrectable row codewords encountered during the previous horizontal pass. If the number of uncorrectable codewords encountered during the previous pass is less than or equal to the number of ECC redundancy symbols of a codeword in the current pass, then the erasure polynomial $\sigma(x)_{EP}$ is used in place of the conventional error-location polynomial σ(x) in order to locate and correct errors in the codewords of the current pass. Thus, the error corrector 14 of FIG. 3 comprises a selector (shown as a multiplexor 20) for selecting between the error-locator polynomial σ(x) and the erasure polynomial $\sigma(x)_{EP}$ depending on the number of uncorrectable codewords encountered during the previous pass.

A root search and error magnitude generator 21 processes the selected polynomial to determine the error locations and error values in correcting the current ECC codeword of the current pass. The error locations are the log of the roots $\alpha^{-1}$ of the error-locator or erasure polynomial (i.e., $\ell$, and the error values are determined from the coefficients $\sigma_i$ of the error-locator or erasure polynomial, the roots $\alpha^{-l}$ of that polynomial, and the error syndromes $S_i$ using any of the methods known in the art. For example, in the above referenced U.S. Pat. No. 5,446,743 entitled "COEFFICIENT UPDATING METHOD AND APPARATUS FOR REED-SOLOMON DECODER," an error evaluator polynomial $\omega(x)$ is first generated by computing its coefficients according to $$\omega_i = \sum_{j=0}^{i} \sigma_j S_{i-j}$$

for i=0, 1, . . . , t-1, where $\sigma_j$ are the coefficients of either the error-locator polynomial $\sigma(x)$ or the erasure polynomial $\sigma(x)_{EP}$. Then the error values $\ell$ are computed according to $$E_l = \frac{\omega(\alpha^{-l})}{\sigma'(\alpha^{-l})}$$

where $\sigma_i$ represents the first derivative of $\sigma$, and $\ell$ is the error location. To correct an error, the symbol from the codeword corresponding to the error location $\ell$ is read from the data buffer 1 and stored in a register 22. The correction value $\ell$ is then added (XORed) 24 to the symbol to correct it, and the corrected symbol is restored to the data buffer 1.

If the erasure polynomial $\sigma(x)_{EP}$ is selected to determine the error locations and error values, then it will be the last pass over the data unless miscorrections occur. It will be the last pass because the maximum number of errors in any codeword will be less than or equal to the number of redundancy symbols in the codeword. Furthermore, the erasure polynomial $\sigma(x)_{EP}$ generated during the previous pass is advantageously used to correct all of the codewords of the current pass rather than regenerating it for each codeword as with the error-locator polynomial $\sigma(x)$. In addition, the erasure polynomial $\sigma(x)_{EP}$ is generated concurrent with correcting the codewords (generating the error syndromes, error-locator polynomial, etc.), which reduces the complexity and cost of the circuitry. These advantages, as well as other aspects and advantages of the present invention, are better understood from the following description of the circuitry and flow diagram operation of the erasure polynomial generator 18.

Erasure Polynomial Generator

Figure 4A:
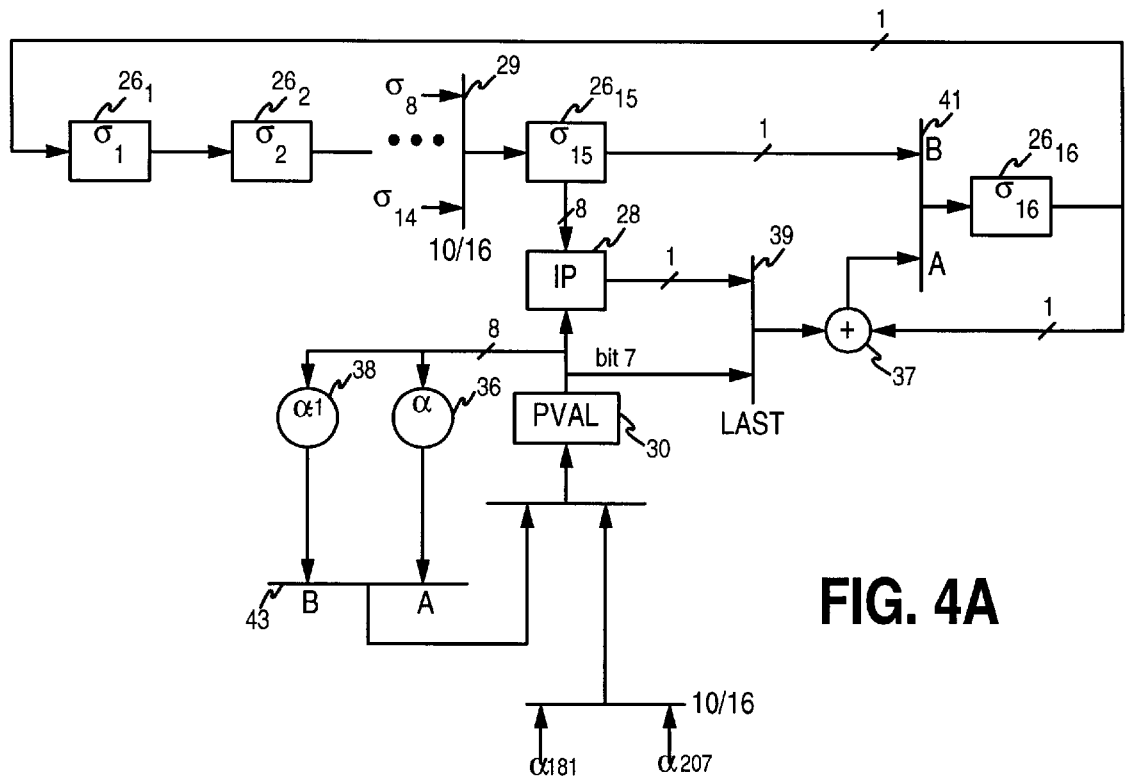
FIG. 4A and 4B show further details of the erasure polynomial generator of the present invention.
Figure 4B:
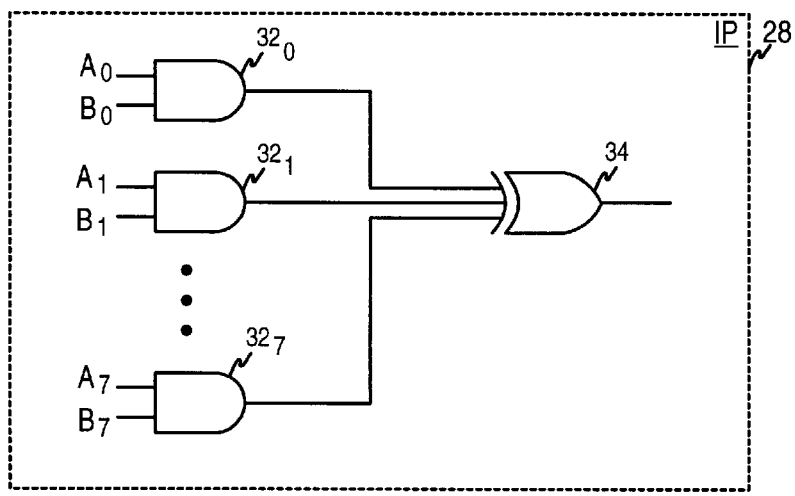

Details of the erasure polynomial generator 18 of FIG. 3 are shown in FIG. 4A and 4B, with an operational description provided in the flow diagrams of FIG. 5A–5D. The circuitry of FIG. 4A generates an erasure polynomial $\sigma(x)_{EP}$ according to $$(\sigma(x))_{EP} = \prod_{i}(1 + \alpha^{l_i}x)$$

where $1_i$ are the locations in the codeword where a symbol may be in error, which correspond to the uncorrectable codewords of a previous pass. Referring to FIG. 2, for example, each uncorrectable row codeword encountered during a horizontal pass corresponds to a symbol in the column codewords that may be in error. Thus, if the third row codeword is uncorrectable during a horizontal pass, then an erasure pointer is generated for the third symbol in every column codeword. Only one erasure polynomial $\sigma(x)_{EP}$ needs to be generated because it is the same for every column codeword (i.e., an uncorrectable row codeword affects the same symbol location in every column codeword).

The circuitry of FIG. 4A is configured such that the initial value for the erasure polynomial is $\sigma(x)_{EP}=1$. Then for each uncorrectable codeword encountered, the erasure polynomial $\sigma(x)_{EP}$ is multiplied by a new factor $(1+\ell)$ where $\ell$ corresponds to the location of the uncorrectable codeword in the current pass with respect to the codewords in the next pass. Mathematically, the circuitry computes $$\sigma(x)_{EP}=\hat{\sigma}(x)_{EP}(1+\ell)$$

where $\hat{\sigma}(x)_{EP}$ is the previous erasure polynomial and $\sigma(x)_{EP}$ is the new erasure polynomial.

At this point, it is important to understand that in the circuitry of FIG. 4A the coefficients $\sigma_i$ of the erasure polynomial $\sigma(x)_{EP}$ are represented in a dual basis as opposed to the conventional basis. The reason for using a dual basis representation is to simplify the the multiplier circuitry of FIG. 4A, as well as to facilitate the root search and error magnitude generator 21 of FIG. 3 which expects to receive the coefficients $\sigma_i$ of the erasure polynomial $\sigma(x)_{EP}$ in the dual basis. Details of the root search and error magnitude generator 21 and its operation in the dual basis is understood from the above referenced U.S. Pat. Nos. 5,446,743 entitled "COEFFICIENT UPDATING METHOD AND APPARATUS FOR REED-SOLOMON DECODER," and 5,467,297 entitled "FINITE FIELD INVERSION." As described in those patents, performing operations in the dual basis reduces the cost and complexity of the circuitry by exploiting bit-serial techniques, an aspect also employed in the present invention To understand the present invention, it is only necessary to understand the concept of a dual basis and how it is used in the circuitry of FIG. 4A.

In a finite field $GF(p^w)$, each element may be viewed as a vector in an w-dimensional vector space. The standard or canonical basis set is $\{\alpha^k\}$ for k=0, 1, . . . , w−1. Let $\{\alpha_k\}$ be a set of basis vectors such that $\alpha_k=\alpha_0\alpha^k$ for k=0, 1, . . . , w−1. The so called dual basis to this set is $\{\beta_k\}$ where $\beta_k$ is chosen such that $\text{tr}(\alpha_k\beta_j)=\alpha^0$ if k is equal to j and $\text{tr}(\alpha_k\beta_j)=0$ if k is not equal to j. The trace function $\text{tr}(x)$ is defined as $$\text{tr}(x) = \sum_{i=0}^{w-1} x^{p^i}$$

Let A be an element of $GF(p^w)$ expressed in the canonical representation which will be referred to as the $\alpha$ representation and let B be an element of $GF(p^w)$ expressed in the dual basis representation which will be referred to as the $\beta$ representation, that is $$A = \sum_{k=0}^{w-1} A_k\alpha^k$$

and $$B = \sum_{k=0}^{w-1} B_k \beta_k$$

where $A_k$ are the components of the vector A and $B_k$ are the components of the vector B. Then $$\text{tr}(\alpha_0 \alpha^k B) = \text{tr}\left(\alpha_k \sum_{j=0}^{w-1} B_j \beta_j\right)$$

$$= \text{tr}\left(\sum_{j=0}^{w-1} B_j \alpha_k \beta_j\right)$$

$$= B_k \alpha^0, k = 0, 1, \ldots, w-1.$$

Let C be the $\beta$ representation of AB and let $(\alpha^k A)_i$ be the components of $\alpha^k A$ in $\alpha$ representation. Then from the above equation $$C_k \alpha^0 = \text{tr}(\alpha_0 \alpha^k AB), k = 0, 1, \ldots, w-1$$

$$= \text{tr}\left(\alpha_0 \sum_{i=0}^{w-1} (\alpha^k A)_i \alpha^i \left(\sum_{j=0}^{w-1} B_j \beta_j\right)\right), k = 0, 1, \ldots, w-1$$

$$= \sum_{i=0}^{w-1} (\alpha^k A)_i \left(\sum_{j=0}^{w-1} B_j \text{tr}(\alpha_i \beta_j)\right), k = 0, 1, \ldots, w-1$$

$$= \sum_{i=0}^{w-1} (\alpha^k A)_i B_i \alpha^0, k = 0, 1, \ldots, w-1$$

Thus $$C_k = \sum_{i=0}^{w-1} (\alpha^k A)_i B_i, k = 0, 1, \ldots, w-1$$

that is, the kth component of the $\beta$ representation of the product of A and B is the inner product of the $\alpha$ representation of $\alpha^k A$ and the $\beta$ representation of B.

This concept of computing the product of two field elements in different basis representations is exploited in the present invention. As described above, to add a new factor (erasure pointer) to the erasure polynomial $\sigma(x)_{EP}$ the circuitry of FIG. 4A computes $$\sigma(x)_{EP} = \hat{\sigma}(x)_{EP}(1+\ell) = \hat{\sigma}(x)_{EP} + \ell \hat{\sigma}(x)_{EP} x$$

where $\hat{\sigma}(x)_{EP}$ is the previous erasure polynomial and $\sigma(x)_{EP}$ is the new erasure polynomial. With $\ell$ the $\alpha$ representation and the coefficients $\sigma_i$ of the erasure polynomial in the $\beta$ representation, then according to the above equations the circuitry of FIG. 4A computes $$(\alpha^l \sigma_i)_k = \sum_{j=0}^{w-1} (\alpha^k \alpha^l)_j (\sigma_i)_j, k = 0, 1, \ldots, w-1$$

$$= \sum_{j=0}^{w-1} \alpha_j^{l+k} (\sigma_i)_j, k = 0, 1, \ldots, w-1$$

and then adds the result of this inner product to the kth component of $\sigma_{i+1}$ for i=15 . . . 1 (adding the inner product to the kth component of $\sigma_{i+1}$ is easily verified from the above equation $$\hat{\sigma}(x)_{EP} + \ell \hat{\sigma}(x)_{EP} x).$$

Having derived the mathematical operation, the structure and interconnections of FIG. 4A will now be described. The circuitry comprises sixteen single-bit shift registers $26_1$–$26_{16}$, where shift registers $26_1$–$26_{16}$ will contain the coefficients $\sigma_{1-16}$ of the erasure polynomial $\sigma(x)_{EP}$ for the column codewords at the end of a horizontal pass, and shift registers $26_1$–$26_8$ and $26_{15-16}$ will contain the coefficients $\sigma_{1-10}$ of the erasure polynomial $\sigma(x)_{EP}$ for the row codewords at the end of a vertical pass. The zero coefficient $\sigma_0$ is always 1, therefore a register is not needed to store its value. The shift registers $26_1$–$26_{16}$ are connected in a ring over a single bit bus as shown, where a multiplexer 29 connects the output of register $\sigma_{14}$ or $\sigma_8$ to the input of register $\sigma_{15}$ depending on whether the current pass is horizontal or vertical (i.e., the erasure polynomial $\sigma(x)_{EP}$ comprises sixteen coefficients for the vertical codewords and ten for the horizontal codewords corresponding to the respective number of redundancy symbols as shown in FIG. 2).

The circuitry of FIG. 4A also comprises an inner product (IP) multiplier 28 for multiplying the current coefficient stored in register $26_{15}$ by a PVAL value stored in register 30. The IP multiplier 28, as shown in FIG. 4B, comprises a number of AND gates $32_0$–$32_7$ and a summing XOR gate 34 to implement the sum of products in the above equation $$\sum_{j=0}^{w-1} (\alpha_j^{l+k} (\sigma_i))_j$$

The content of the PVAL register 30 is multiplied by an $\alpha$ multiplier 36 after each inner product multiplication (i.e., for k=0 . . . w-1) to implement the $\alpha^{1+k}$ operation of the above equation. An $\alpha^{-1}$ multiplier 38 is then used to re-adjust the $\alpha$ operand from $\alpha^{1+8}$ to $\alpha^1$, and to decrement 1 before processing the next codeword.

In the embodiment shown in FIG. 4A, the symbols size of the codeword is 8 bits (i.e., w=8). Thus to add an erasure pointer to the erasure polynomial, the circuitry of FIG. 4A executes an "A phase" in 8 clock cycles to compute the inner product for the 8 bits of $(\alpha^1 \sigma_i)_k$, for k=0 . . . 7. During each clock cycle of the "A phase", a bit is shifted out of the $\sigma_{16}$ register $26_{16}$ and added at adder 37 to the output of the inner product multiplier 28 selected through multiplexer 39. The output of adder 37 is then restored to the $\sigma_{16}$ register $26_{16}$ through multiplexer 41. Also during each cycle of the "A phase", the output of the PVAL register is multiplied by $\alpha$ 36 and the result restored to the PVAL register 30 through multiplexer 43.

When the "A phase" finishes after 8 clock cycles, a "B phase" is executed during the next 8 clock cycles wherein the contents of the $\sigma_i$ registers $26_{1-16}$ are shifted to the right such that $\sigma_{i+1} = \sigma_i$ and $\sigma_1 = \sigma_{16}$. Also during each clock cycle of the "B phase", the PVAL register 30 is multiplied by $\alpha^{-1}$ to restore it to its original value.

The "A phase" and the "B phase" are re-iterated 16 times during a horizontal pass to update the 16 coefficients $\sigma_{1-16}$ of the erasure polynomial used to correct the vertical codewords, or 10 times during a vertical pass to update the 10 coefficients $\sigma_{1-10}$ of the erasure polynomial used to correct the horizontal codewords. Since the zero coefficient $\sigma_0$ is always 1, during the last of the 16 or 10 iterations bit 7 of the PVAL register is selected through multiplexer 39 and added to the bits of $\sigma_{16}$ (i.e., the inner product of $\sigma_0 = 1 = 1000000$ and PVAL is bit 7 of PVAL). In this manner, it is not necessary to store the $\sigma_0$ coefficient in a separate register.

The operation of the circuitry shown in FIG. 4A is further understood with reference to the flow diagrams of FIG. 5A–5D. Before the first horizontal pass, a variable VERT. ERRS is initialized to 11 at step 40 of FIG. 5A so that the erasure polynomial σ(x)$_{EP}$ will not be used to generate the error locations and error values during the first horizontal pass (the erasure polynomial is undefined during the first horizontal pass). Also at step 40, the erasure polynomial σ(x)$_{EP}$ is initialized to 1 (the circuitry of FIG. 4A actually operates as if the erasure polynomial σ(x)$_{EP}$ were initially 1, as described above). During the next step (step 42), certain variables are initialized for the first and subsequent horizontal passes: a counter variable HORZ. ERRS is initialized to zero to indicate that no uncorrectable row codewords have been encountered, an index variable ROW is initialized to zero to point to the first row codeword, and a PVAL register (see FIG. 4A) is initialized to a $\alpha^{207}$ corresponding to erasure location $\ell$=207 in a vertical codeword.

At step 44, the P/Q decoder generates the ECC syndromes for the current horizontal codeword at ROW. The ECC syndromes are then evaluated at step 46 to determine whether the codeword is correctable. If the codeword is not correctable, then an erasure pointer is generated and added to the current erasure polynomial σ(x)$_{EP}$ at step 48 by executing the flow diagram of FIG. 5C, described below, and the HORIZ. ERRS variable is incremented at step 50. If the codeword is correctable at step 46, then at step 52 a branch is executed depending on VERT. ERRS, the number of uncorrectable column codewords encountered during the previous vertical pass. If VERT. ERRS is greater than 10, then the erasure polynomial σ(x)$_{EPH}$ generated during the previous vertical pass cannot be used to correct the horizontal codewords. Instead, at step 54 an error locator polynomial σ(x) is generated using the ECC syndromes generated at step 44. If the VERT. ERRS is not greater than 10 at step 52, then the erasure polynomial σ(x)$_{EPH}$ generated during the previous vertical pass can be used to correct the horizontal codeword, therefore the erasure polynomial σ(x)$_{EPH}$ is assigned to the error locator polynomial at step 56. The current horizontal codeword is then corrected at step 58 using the error locator polynomial and the ECC syndromes generated at step 44 (see FIG. 3 and above discussion).

At step 60, the PVAL register is multiplied by $\alpha^{-1}$, thereby decrementing the erasure pointer location $\ell$ so that it corresponds to the next symbol in the vertical codewords. The ROW variable is incremented at step 62 to the next row codeword, and the above procedure is re-iterated until ROW equals 208 at step 64 indicating that all of the row codewords have been processed. If at step 66 the product code has been successfully corrected after the horizontal pass, then the process simply exits. Otherwise, the current erasure polynomial σ(x)$_{EP}$ is saved at step 68 by assigning it to σ(x)$_{EPV}$ (i.e., the contents of the coefficient registers $\sigma_1$–$\sigma_{16}$ of FIG. 4A are transferred to a set of storage registers). The saved coefficients of the erasure polynomial σ(x)$_{EPV}$ are then used to correct the column codewords during the next vertical pass concurrent with generating a new erasure polynomial σ(x)$_{EP}$ using the coefficient registers $\sigma_1$–$\sigma C_{16}$ and circuitry of FIG. 4A.

Figure 5A:
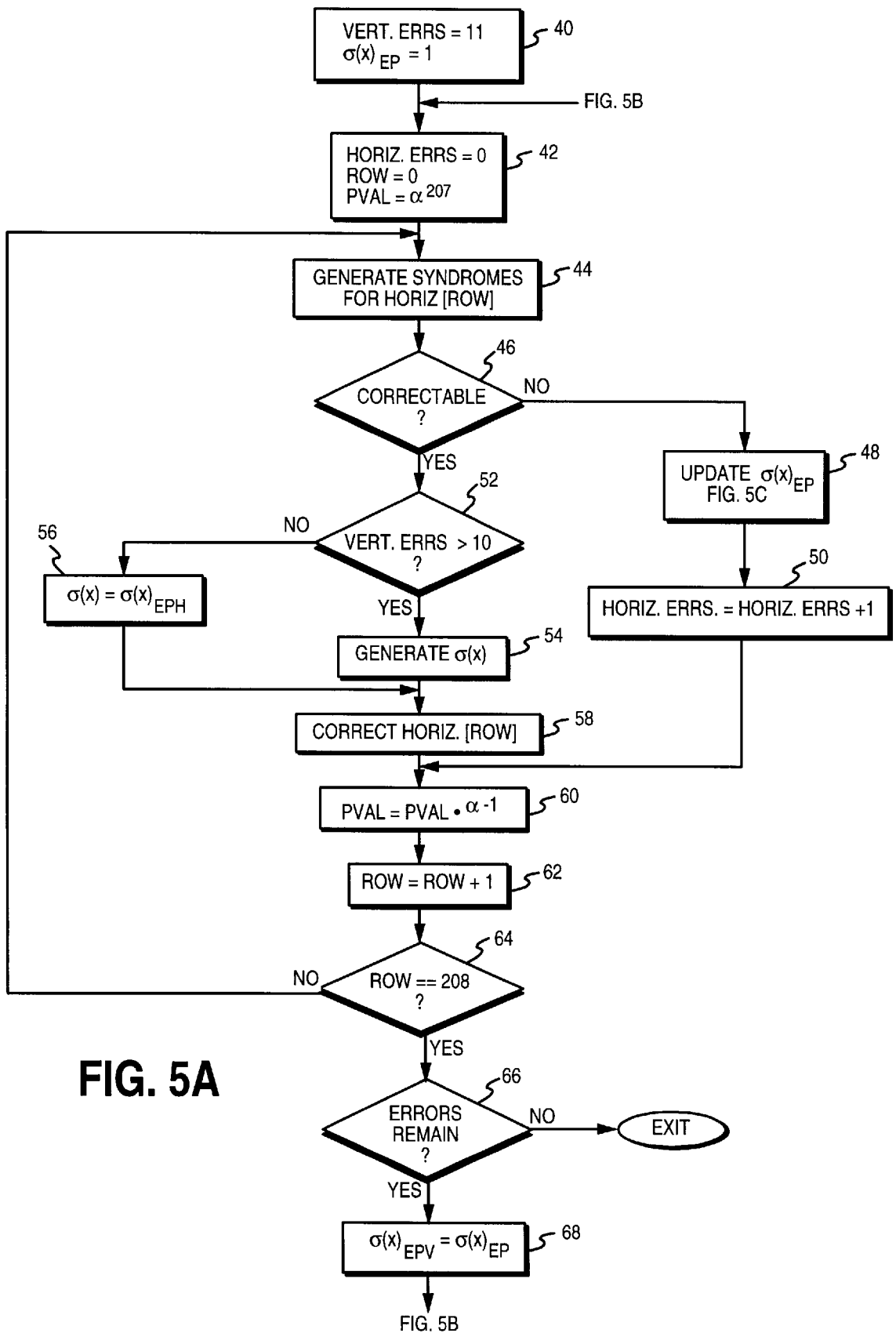
FIG. 5A is a flow diagram executed during a horizontal pass over the two-dimensional code of FIG. 2, including the steps of updating the erasure polynomial with the appropriate factor when an uncorrectable codeword is encountered.
Figure 5B:
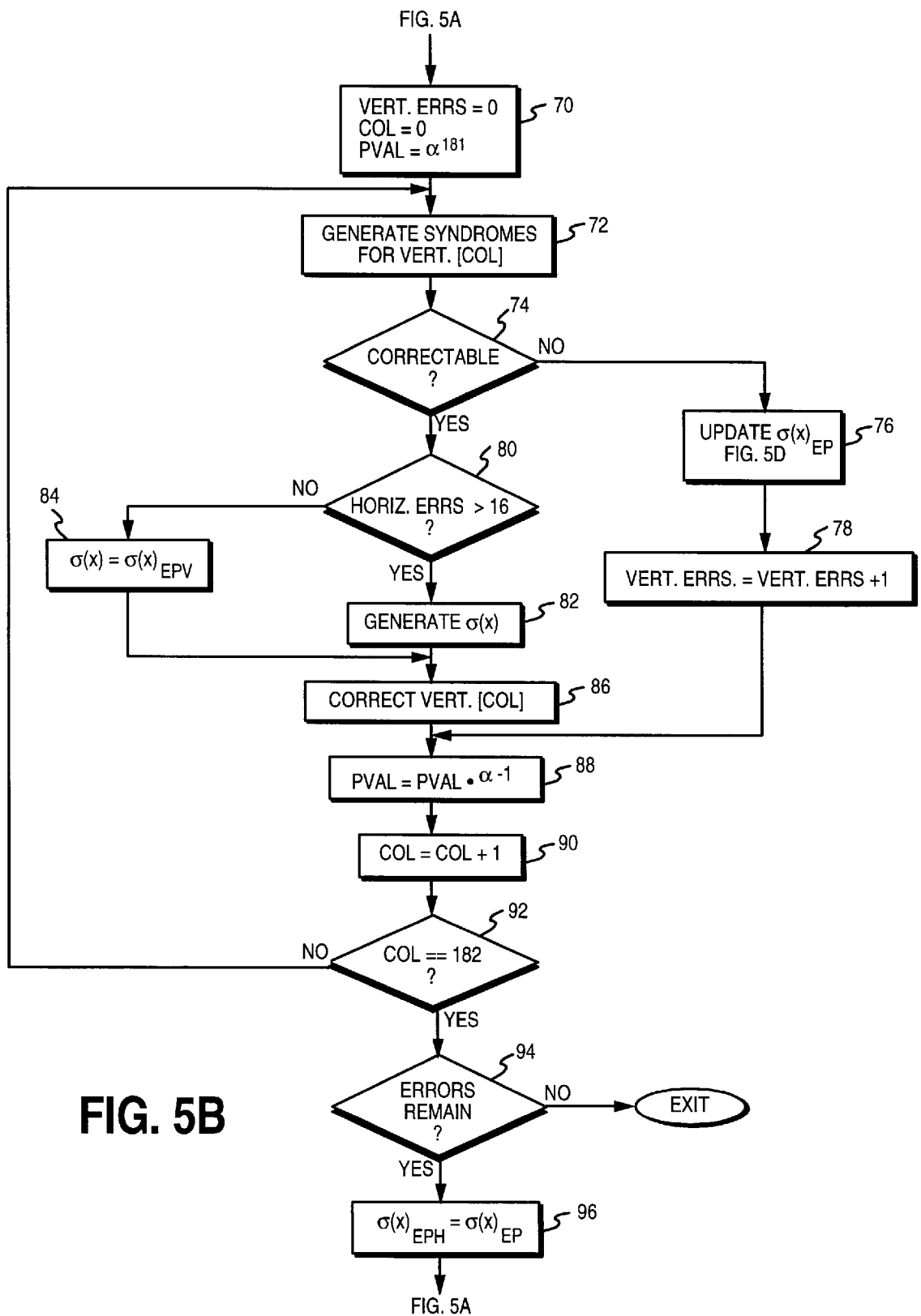
FIG. 5B is a flow diagram executed during a vertical pass over the two-dimensional code of FIG. 2, including the steps of updating the erasure polynomial with the appropriate factor when an uncorrectable codeword is encountered.

The flow diagram executed during a vertical pass is shown in FIG. 5B. At step 70, a VERT. ERRS variable representing the number of uncorrectable column codewords encountered is initialized to zero, a COL variable is initialized to zero to point to the first column codeword, and the PVAL register is initialized to $\alpha^{181}$ corresponding to erasure location $\ell$=181 in a horizontal codeword. At step 72 the P/Q decoder generates the ECC syndromes for the current column codeword at COL. The ECC syndromes are then evaluated at step 74 to determine whether the codeword is correctable. If the codeword is not correctable, then an erasure pointer is generated and added to the current erasure polynomial σ(x)$_{EP}$ at step 76 by executing the flow diagram of FIG. 5D, described below, and the VERT. ERRS variable is incremented at step 78. If the codeword is correctable at step 74, then at step 80 a branch is executed depending on HORIZ. ERRS, the number of uncorrectable row codewords encountered during the previous horizontal pass. If HORIZ. ERRS is greater than 16, then the erasure polynomial σ(x)$_{EPV}$ generated during the previous horizontal pass cannot be used to correct the vertical codewords. Instead, at step 82 an error locator polynomial σ(x) is generated using the ECC syndromes generated at step 72. If the HORIZ. ERRS is not greater than 16 at step 80, then the erasure polynomial σ(x)$_{EPV}$ generated during the previous horizontal pass can be used to correct the vertical codeword, therefore it is assigned to the error locator polynomial at step 84. The current vertical codeword is then corrected at step 86 using the error locator polynomial and the ECC syndromes generated at step 72 (see FIG. 3 and above discussion).

At step 88, the PVAL register is multiplied by $\alpha^{-1}$, thereby decrementing the erasure pointer location $\ell$ so that it corresponds to the next symbol in the horizontal codewords. The COL variable is then incremented at step 90 to the next column codeword, and the above procedure is re-iterated until COL equals 182 at step 92 indicating that all of the column codewords have been processed. If at step 94 the product code has been successfully corrected after the vertical pass, then the process simply exits. Otherwise, the current erasure polynomial σ(x)$_{EP}$ is saved at step 96 by assigning it to σ(x)$_{EPH}$ (i.e., the contents of the coefficient registers $\sigma_1$–$\sigma_{16}$ of FIG. 4A are transferred to a set of storage registers). The saved coefficients of the erasure polynomial σ(x)$_{EPH}$ are then used to correct the row codewords during the next horizontal pass concurrent with generating a new erasure polynomial σ(x)$_{EP}$ using the coefficient registers $\alpha_1$–$\sigma_{16}$ and circuitry of FIG. 4A.

Figure 5C:
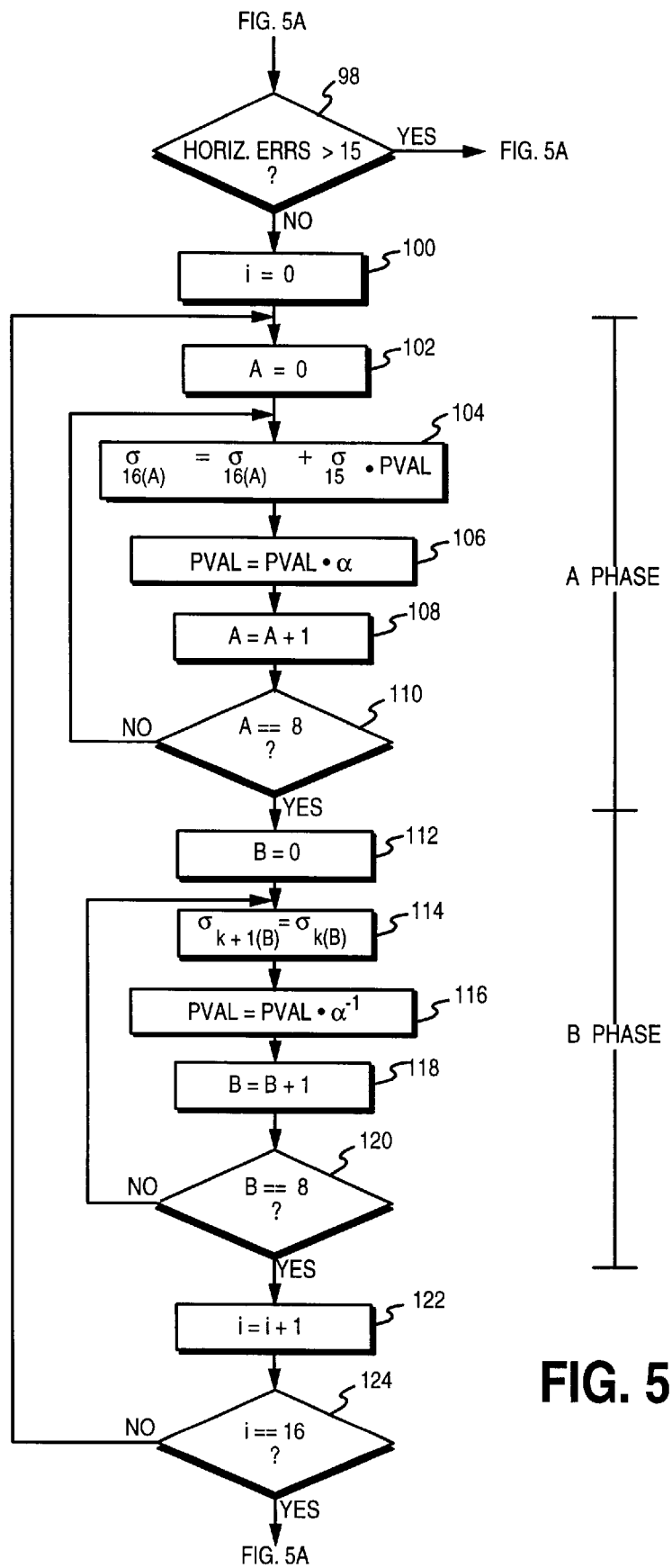
FIG. 5C is a flow diagram for adding a factor to the erasure polynomial when an uncorrectable row codeword is encountered during a horizontal pass.

The flow diagram executed to update the erasure polynomial σ(x)$_{EP}$ during a horizontal pass (step 48 of FIG. 5A) is shown in FIG. 5C. If at step 98 the number of uncorrectable horizontal codewords HORIZ. ERRS is greater than 15, then control simply returns to FIG. 5A because there are already too many uncorrectable horizontal codewords-the erasure polynomial σ(x)$_{EP}$ cannot be used to correct the column codewords during the next vertical pass if there are more than 16 erasure pointers. If HORIZ. ERRS is not greater than 15 at step 98, then at step 100 a counter variable i, which tracks the 16 iterations of the above-described "A phase" and "B phase", is initialized to zero. At step 102 a counter A, which tracks the 8 clock cycles of the "A phase", is initialized to zero. Then at step 104, bit A of the $\sigma_{16}$ coefficient register $26_{16}$ of FIG. 4A is updated by adding its contents to the inner product of PVAL and the $\sigma_{15}$ coefficient stored in the coefficient register $26_{15}$ as described above. The PVAL register is then updated by multiplying its contents by $\alpha$ at step 106, and the counter variable A is incremented at step 108. The above procedure is then re-iterated until A equals 8 at step 110 indicating the end of the "A phase".

At the beginning of the "B phase", a variable B which tracks the 8 clock cycles, is initialized to zero at step 112. Then at step 114, bit B of the $\sigma_k$ coefficient register $26_k$ is shifted into bit B of $\sigma_{k+1}$ coefficient register $26_{k+1}$. At step 116, the PVAL register is multiplied by $\alpha^{-1}$, and at step 118, the counter variable B is incremented. The above procedure is re-iterated until B equals 8 at step 120 indicating the end of the "B phase".

At step 122, the counter i is incremented and the A and B phases re-iterated until i equals 16 at step 124 indicating the end of the update procedure to add an erasure pointer for an uncorrectable row codeword. During the last iteration (i=15) as described above, at step 104 the bits of the $\sigma_{16}$ coefficient register 26$_{16}$ are simply added to bit 7 of PVAL since the $\sigma_0$ coefficient of the erasure polynomial $\sigma_{EP}(x)$ is always equal to 1.

Figure 5D:
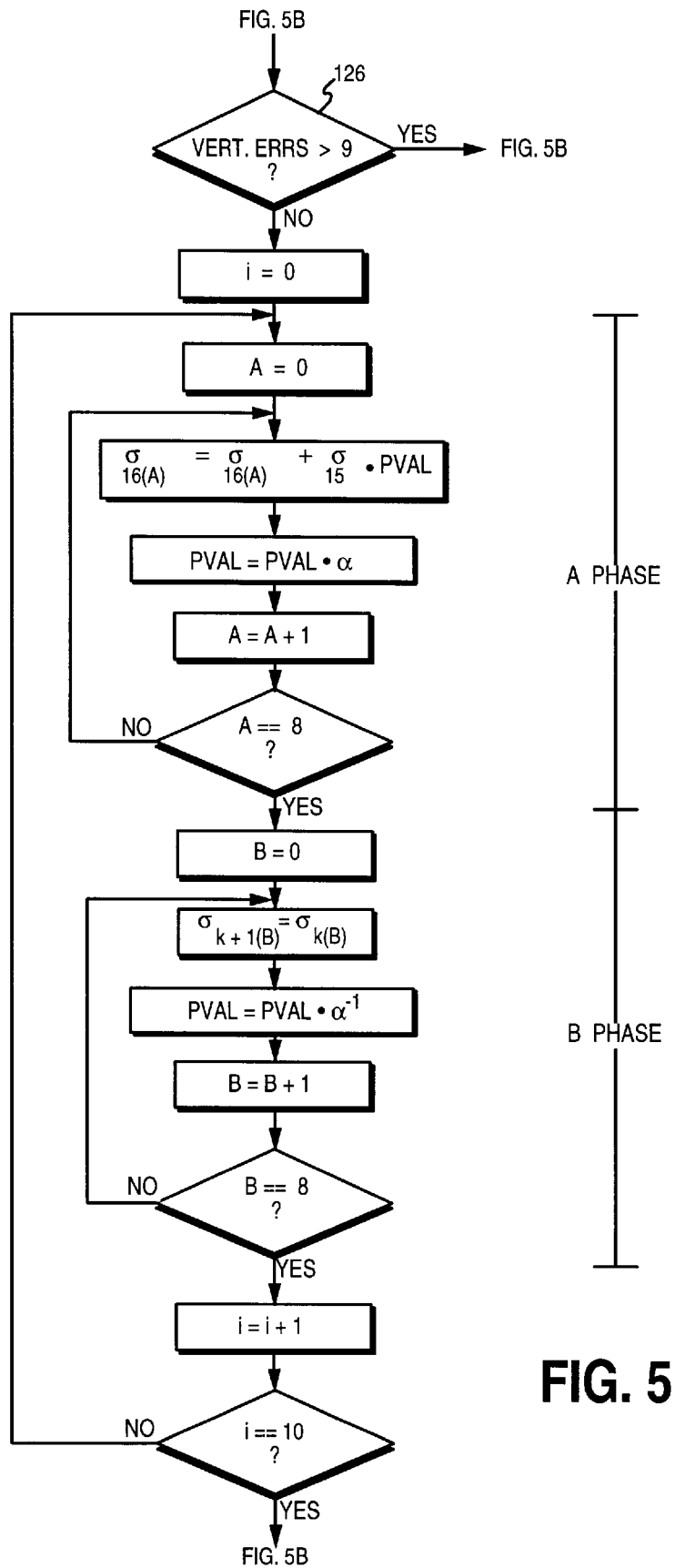
FIG. 5D is a flow diagram for adding a factor to the erasure polynomial when an uncorrectable column codeword is encountered during a vertical pass.

The flow diagram executed to update the erasure polynomial $\sigma G(x)_{EP}$ during a vertical pass (step 76 of FIG. 5B) is shown in FIG. 5D. The steps are essentially identical to that of FIG. 5C, except that at step 126 control returns to FIG. 5B if the number of uncorrectable vertical codewords VERT. ERRS exceeds 9, indicating that the erasure polynomial $\sigma_{EP}(x)$ cannot be used to correct the row codewords during the next horizontal pass because there are only 10 ECC redundancy symbols in the row codewords (i.e., up to 10 row codeword symbols can be corrected). Also, the A and B phases are re-iterated only 10 times to update the 10 coefficients of the erasure polynomial $\sigma_{EP}(x)$ generated during a vertical pass.

Although the erasure polynomial update procedures of FIG. 5C and 5D require 16 and 10 iterations, respectively, of the A and B phases to add a single erasure pointer, typically they do not introduce any additional latency because the circuitry of FIG. 4A operates concurrent with the error correction procedure of FIG. 5A and 5B. Furthermore, the number of uncorrectable codewords encountered is typically small and cannot exceed the maximum for the vertical and horizontal passes (10 and 16) otherwise the update procedure is bypassed. Consequently, the complexity and cost of the circuitry in FIG. 4A is minimized by using bit-serial techniques without compromising the overall speed of the correction system.

In fact, during the last pass over the product code (horizontal or vertical) when the erasure polynomial $\sigma_{EP}(x)$ is used to correct the codewords, the correction speed actually increases because it is not necessary to generate the conventional error locator polynomial $\sigma(x)$ at step 54 of FIG. 5A and at step 82 of FIG. 5B. Furthermore, it is not necessary to generate an erasure polynomial $\sigma_{EP}(x)$ for each codeword; a single erasure polynomial $\sigma_{EPH}(x)$ or $\sigma_{EPV}(x)$ is used to correct all of the codewords (step 56 of FIG. 5A and step 84 of FIG. 5B).

Thus, the objects of the invention have been fully realized through the embodiments disclosed herein. Those skilled in the art will appreciate that the various aspects of the invention can be achieved through different embodiments without departing from the essential function. For example, the product code shown in FIG. 2 is typically employed in digital video disks (DVDs), but the present invention is equally applicable to other product code formats, including the format used in compact disks (CDs). Furthermore, the present invention could be applied to other multi-dimensional codes, not just product codes. Thus, the particular embodiments disclosed are illustrative and not meant to limit the scope of the invention as appropriately construed by the following claims.

What is claimed is:

1. An error correction processor for correcting errors in binary data read from a disk storage medium, wherein the binary data comprises a first and second set of intersecting ECC codewords of a multi-dimensional codeword, the error correction processor comprising:

(a) a data buffer for storing the ECC codewords read from the disk storage medium;

(b) a syndrome generator for generating ECC syndromes in response to an ECC codeword in the second set;

(c) an error-locator polynomial generator for generating an error locator polynomial $\sigma(x)$ in response to the ECC syndromes;

(d) a selector for selecting between the error-locator polynomial $\sigma(x)$ and an erasure polynomial $\sigma(x)_{EP}$, wherein:

(i) the erasure polynomial $\sigma(x)_{EP}$ is generated while processing the first set codewords; and (ii) the erasure polynomial $\sigma(x)_{EP}$ is used to correct at least two codewords in the second set; and (e) an error corrector for generating correction values in response to either the error-locator polynomial $\sigma(x)$ or the erasure polynomial $\sigma(x)_{EP}$ output by the selector, the correction values for correcting errors in the ECC codeword in the second set.

2. The error correction processor as recited in claim 1, wherein a factor of the erasure polynomial is generated for at least two uncorrectable codewords encountered while processing the first set codewords.

3. The error correction processor as recited in claim 2, wherein:

(a) the first and second set codewords are generated according to a generator polynomial G(x) of a finite field;

(b) the erasure polynomial $\sigma(x)_{EP}$ is generated according to $$(\sigma(x))_{EP} = \prod (1 + \alpha^k x)$$

(c) $\alpha$ is a primitive element of the finite field; and (d) k is a symbol location in a second set codeword corresponding to where the second set codeword intersects with an uncorrectable first set codeword.

4. The error correction processor as recited in claim 3, further comprising an erasure polynomial generator for generating the erasure polynomial $\sigma(x)_{EP}$ by multiplying an intermediate polynomial $\hat{\sigma}(x)$ by a factor $(1+\alpha^k x)$ when an uncorrectable first set codeword is encountered.

5. The error correction processor as recited in claim 4, wherein the erasure polynomial generator comprises an inner-product multiplier for multiplying a first coefficient of the intermediate polynomial $\hat{\sigma}(x)$ by a constant corresponding to k to generate a product.

6. The error correction processor as recited in claim 5, wherein the coefficient of the intermediate polynomial $\hat{\sigma}(x)$ is represented in a first basis and the constant corresponding to k is represented in a second basis.

7. The error correction processor as recited in claim 5, wherein the erasure polynomial generator further comprises an adder for adding the product to a second coefficient of the intermediate polynomial $\hat{\sigma}(x)$.

8. The error correction processor as recited in claim 7, wherein (a) the product is generated serially in a plurality of steps by computing a plurality of intermediate products; and (b) each intermediate product comprises less bits than the second coefficient of the intermediate polynomial $\hat{\sigma}(x)$.

9. The error correction processor as recited in claim 5, wherein the erasure polynomial generator further comprises a plurality of registers for storing coefficients of the intermediate polynomial $\hat{\sigma}(x)$, wherein:

(a) the registers are connected in series to form a shift register; and (b) one of the registers is connected to the inner-product multiplier.

10. The error correction processor as recited in claim 4, wherein the erasure polynomial generator further comprises an $\alpha^j$ multiplier connected to multiply the constant corresponding to k by $\alpha^j$, where j is an integer.

11. The error correction processor as recited in claim 10, wherein j is −1.

12. A method of correcting errors in binary data read from a disk storage medium, wherein the binary data comprises a first and second set of intersecting ECC codewords of a multi-dimensional codeword, comprising the steps of:

(a) generating a first erasure polynomial $\sigma(x)_{EP}$ while processing the first set codewords;

(b) generating ECC syndromes in response to a second set codeword;

(c) generating an error locator polynomial $\sigma(x)$ in response to the ECC syndromes;

(d) generating correction values in response to either the error-locator polynomial $\sigma(x)$ or the first erasure polynomial $\sigma(x)_{EP}$;

(e) correcting errors in the second set codeword using the correction values; and (f) repeating steps (b) through (e) at least once.

13. The method of correcting errors as recited in claim 12, further comprising the step of generating a factor of the first erasure polynomial for at least two uncorrectable codewords encountered while processing the first set codewords.

14. The method of correcting errors as recited in claim 13, further comprising the steps of:

(a) generating the first and second set codewords according to a generator polynomial G(x) of a finite field;

(b) generating the first erasure polynomial $\sigma(x)_{EP}$ according to $$(\sigma(x))_{EP} = \prod (1 + \alpha^k x)$$

wherein $\alpha$ is a primitive element of the finite field, and k is a symbol location in a second set codeword corresponding to where the second set codeword intersects with an uncorrectable first set codeword.

15. The method of correcting errors as recited in claim 14, wherein the step of generating the first erasure polynomial $\sigma(x)_{EP}$ comprises the steps of multiplying an intermediate polynomial $\hat{\sigma}(x)$ by a factor $(1+\alpha^k x)$ when an uncorrectable first set codeword is encountered.

16. The method of correcting errors as recited in claim 15, wherein the step of generating the first erasure polynomial $\sigma(x)_{EP}$ further comprises the step of taking an inner-product of a first coefficient of the intermediate polynomial $\hat{\sigma}(x)$ and a constant corresponding to k to generate a product.

17. The method of correcting errors as recited in claim 16, wherein the coefficient of the intermediate polynomial $\hat{\sigma}(x)$ is represented in a first basis and the constant corresponding to k is represented in a second basis.

18. The method of correcting errors as recited in claim 16, wherein the step of generating the first erasure polynomial $\sigma(x)_{EP}$ further comprises the step of adding the product to a second coefficient of the intermediate polynomial $\hat{\sigma}(x)$.

19. The method of correcting errors as recited in claim 18, wherein the step of taking the inner-product comprises the step of generating a plurality of intermediate products, where each intermediate product comprises less bits than the second coefficient of the intermediate polynomial $\hat{\sigma}(x)$.

20. The method of correcting errors as recited in claim 16, wherein the step of generating the first erasure polynomial $\sigma(x)_{EP}$ further comprises the step of:

(a) shifting the coefficients of the intermediate polynomial $\hat{\sigma}(x)$ through a plurality of registers; and (b) taking the inner-product of one of the registers and the constant corresponding to k.

21. The method of correcting errors as recited in claim 15, wherein the step of generating the first erasure polynomial $\sigma(x)_{EP}$ further comprises the step of multiplying the constant corresponding to k by $\alpha^j$, where j is an integer.

22. The method of correcting errors as recited in claim 21, wherein j is −1.

23. The method of correcting errors as recited in claim 12, further comprising the steps of:

(g) generating a second erasure polynomial $\sigma(x)_{EP}$ while processing the second set codewords;

(h) generating ECC syndromes in response to a first set codeword;

(i) generating an error locator polynomial $\sigma(x)$ in response to the ECC syndromes;

(j) generating correction values in response to either the error-locator polynomial $\sigma(x)$ or the second erasure polynomial $\sigma(x)_{EP}$;

(k) correcting errors in the first set codeword using the correction values; and (l) repeating steps (h) through (k) at least once.

24. An error correction processor for correcting errors in binary data read from a disk storage medium, wherein the binary data comprises intersecting row and column ECC codewords of a product code, the error correction processor comprising:

(a) a syndrome generator for generating ECC syndromes in response to a column codeword;

(b) an error-locator polynomial generator for generating an error locator polynomial $\sigma(x)$ in response to the ECC syndromes;

(c) a selector for selecting between the error-locator polynomial $\sigma(x)$ and an erasure polynomial $\sigma(x)_{EP}$, wherein:

(i) the erasure polynomial $\sigma(x)_{EP}$ is generated while processing the row codewords; and (ii) the erasure polynomial $\sigma(x)_{EP}$ is used to correct at least two column codewords; and (d) an error corrector for generating correction values in response to either the error-locator polynomial $\sigma(x)$ or the erasure polynomial $\sigma(x)_{EP}$ output by the selector, the correction values for correcting errors in the column codeword.

25. The error correction processor as recited in claim 24, wherein a factor of the erasure polynomial is generated for at least two uncorrectable codewords encountered while processing the row codewords.

26. The error correction processor as recited in claim 25, wherein:

(a) the row and column codewords are generated according to a generator polynomial G(x) of a finite field;

(b) the erasure polynomial $\sigma(x)_{EP}$ is generated according to $$(\sigma(x))_{EP} = \prod (1 + \alpha^k x)$$

(c) $\alpha$ is a primitive element of the finite field; and (d) k is a symbol location in a column codeword corresponding to where the column codeword intersects with an uncorrectable row codeword.

27. The error correction processor as recited in claim 26, further comprising an erasure polynomial generator for generating the erasure polynomial $\sigma(x)_{EP}$ by multiplying an intermediate polynomial $\hat{\sigma}(x)$ by a factor $(1+\alpha^k x)$ when an uncorrectable row codeword is encountered.

* * * * *